United States Patent

Schulmann et al.

[11] Patent Number: 5,846,322
[45] Date of Patent: Dec. 8, 1998

[54] APPARATUS FOR DRAWING SINGLE CRYSTALS

[75] Inventors: Winfried Schulmann, Kleinostheim; Helmut Kaiser, Bruchköbel; Franz Thimm, Alzenau, all of Germany

[73] Assignee: Balzers UND Leybold Deutschland Holding AG, Hanau, Germany

[21] Appl. No.: 820,273

[22] Filed: Mar. 18, 1997

[30]   Foreign Application Priority Data

Apr. 3, 1996  [DE]  Germany .................. 196 13 282.7

[51] Int. Cl.⁶ .................................................. C30B 35/00
[52] U.S. Cl. .................... 117/216; 117/208; 117/215; 117/218
[58] Field of Search .............. 117/13, 35, 200, 117/208, 215, 216, 218, 900

[56]  References Cited

U.S. PATENT DOCUMENTS

| | | | |
|---|---|---|---|
| 3,822,111 | 7/1974 | Suzuki et al. | 117/215 |
| 4,301,120 | 11/1981 | Sibley | 117/218 |
| 4,350,560 | 9/1982 | Helgeland et al. | 117/35 |

FOREIGN PATENT DOCUMENTS

| | | |
|---|---|---|
| 3152850 | 10/1982 | Germany . |
| 4329283 | 3/1995 | Germany . |
| 1224292 | 10/1989 | Japan . |

*Primary Examiner*—Felisa Garrett
*Attorney, Agent, or Firm*—Fulbright & Jaworski

[57]  ABSTRACT

A crucible is mounted on a crucible support bolt (11, 34) in a vacuum chamber (33) resting on a base stand (32) and can be heated by the thermal radiation of a heating element. A drawing element (35) is provided above the melt, by means of which the crystal can be drawn up from the surface of the melt into a transfer lock chamber (36), which can be pivoted laterally with respect to the base stand (32). A separating device is provided between the crystal and the drawing element (35) to separate the crystal from the drawing element (35). The base stand (32) is formed by a platform (38) supported by four posts (37) three additional legs (39) of equal length extend upward from three of the four corners of the rectangular platform (38) holding the vacuum chamber (33), these (39) being held together at their top ends by a horizontal frame (40), which forms a right triangle. The surface projected by this frame (40) onto the platform (38) encloses approximately half of the surface of the platform, and a boom or pivot arm (41) is mounted on at least one of the legs (39), for pivoting the transfer lock chamber (36) from a position above the crucible.

4 Claims, 3 Drawing Sheets

APPARATUS FOR DRAWING SINGLE CRYSTALS

BACKGROUND OF THE INVENTION

The invention pertains to an apparatus for drawing single crystals from a melt in a crucible under vacuum or under a shielding gas at reduced pressure. The crucible is mounted on a crucible support bolt in a vacuum chamber resting on a support stand and can be heated by the thermal radiation of a heating element. A drawing element is provided above the melt, by means of which the crystal can be drawn up out of the surface of the melt and into a transfer lock chamber, which can be pivoted laterally with respect to the base stand. A separating device, which is provided between the crystal and the drawing element to separate the crystal from the drawing element.

Apparatus for drawing crystals usually comprise a framework or support structure of metal pipes or metal sections, to which the assemblies required for the drawing process such as the vacuum chamber, the transfer lock, the transfer lock chamber, the drawing element, etc., are attached.

DE 1290117 discloses an apparatus for zone melting without a crucible, consisting of two vertical guide columns, which are attached to a platform and which are connected to each other at the top by a transverse strut. The columns support two arms carrying the rod holders; the arms can be moved relative to each other and relative to a stationary heating device; the arms are coupled to a differential gear, and the two guide columns are equipped with two bracing elements, which are fastened by screw threads to the transverse strut at the top and to the platform at the bottom; these bracing elements extend at a slant to the guide columns and to each other. The guide columns are connected to the platform by flexible links in the form of slots open toward the side of the bracing elements, the two flexible links being at the same height.

This known apparatus is not suitable for systems used to draw very large crystals, because the individual assemblies of such a large apparatus are too bulky and too heavy for installation into the known support structure and too inaccessible for the operating personnel.

A 3-dimensional framework with two operating platforms is also known (GM 92 15 780.7), especially for an apparatus for melting, casting, and/or spraying materials, with at least one evacuatable process chamber or a process chamber which can be filled with a process gas, in which the base surfaces of the two operating platforms form equally large right-triangular surfaces, which are provided on two horizontal planes which are parallel to each other;

where the two operating platforms are held a certain distance apart by vertical posts or stanchions supported on the base surface, each of these posts or stanchions being attached to the horizontal beams which delimit and frame the operating platforms;

where two of the posts are attached to the outer ends of the beams which form the bases of the right-isosceles triangles forming the two operating platforms;

where an additional pair of adjacent posts is located in the central area of these two beams and attached permanently to them;

where a third pair of posts is provided in the area of the connecting points between the two pairs of beams which form the sides (perpendiculars) of the flat, triangular surfaces forming the operating platforms;

where a framework of grid-like struts, which are parallel to the pairs of beams forming the two perpendicular sides of the triangle, extends all the way across each of the two operating platforms;

where the openings between adjacent struts and/or adjacent beams of the framework are covered by flooring plates, grids, or gratings, which are connected detachably to the struts or beams; and where a process chamber and/or components of the melting, casting, or spraying apparatus project through one or more openings in the framework, the apparatus being supported on the ground or held by struts.

This known 3-dimensional framework is hardly suitable for an especially narrow and thus extremely tall apparatus, such as that used for the purpose of drawing crystals, because, first, the base surface occupied by the 3-dimensional framework is disproportionately large and, second, there is no possibility of mounting pivot arms on the framework for the horizontal transport of heavy pieces of machinery.

SUMMARY OF THE INVENTION

The present invention provides an apparatus, which can be built with maximum rigidity and at low cost, which offers the best possible access to all assemblies, and which in particular makes it possible to remove the finished crystal without difficulty of any kind.

In accordance with the invention, the base stand is formed by a platform supported by posts, where additional legs are provided at three of the four corners of the approximately rectangular platform which holds the vacuum chamber, these three vertical legs of equal length being held together at their top ends by a horizontal frame forming a right triangle. The surface projected by this frame onto the platform encloses approximately one half of the platform surface, and a boom or pivot arm, to which the transfer lock chamber is attached, is mounted on at least one of the legs. The transfer lock chamber is parallel to the legs and extends approximately as far as the cover of the vacuum chamber.

DETAILED DESCRIPTION OF THE PREFERRED EMBODIMENT

Figure 1:
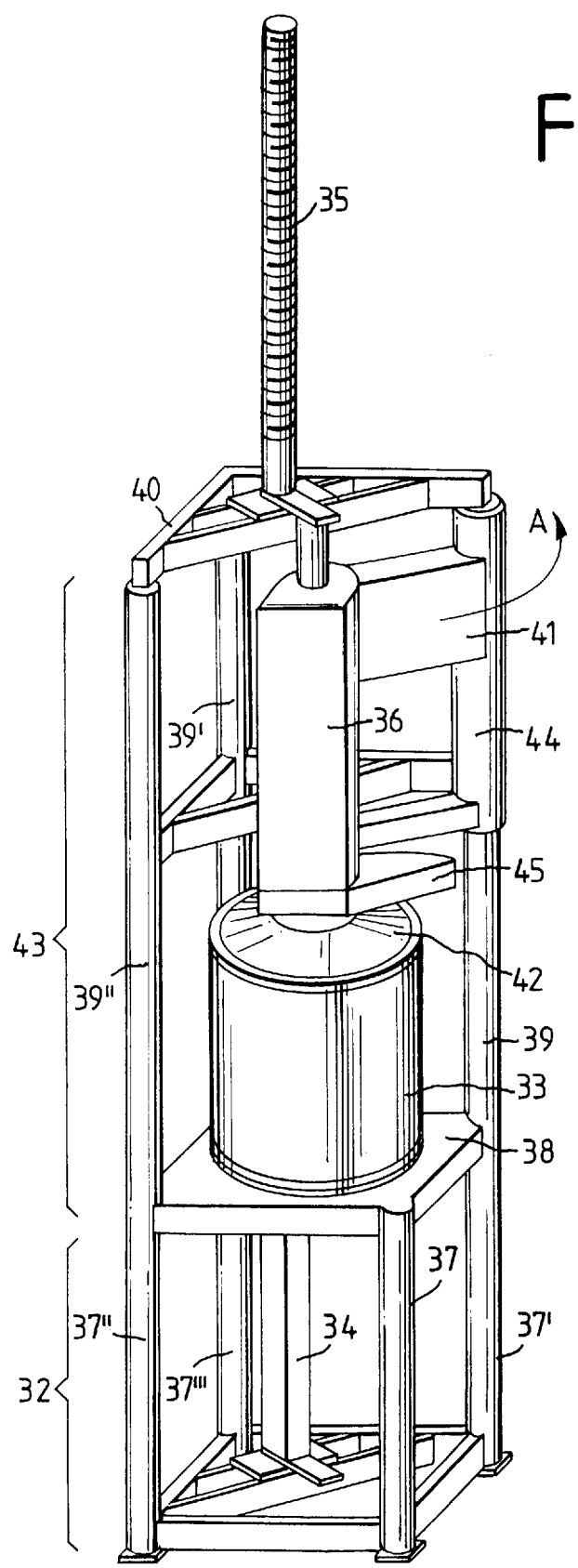
FIG. 1 shows a perspective view of an apparatus according to the invention with a four-legged lower stand and a three-legged upper stand.

The apparatus according to FIG. 1 consists essentially of: a base stand 32 with a total of four vertical posts 37, which are located at the corners of an approximately square platform 38; a vacuum chamber 33 with cover 42, resting on platform 38; an upper stand 43, consisting of a total of three legs 39, which are preferably designed as extensions of posts 37, and which are held together by a frame 40, which forms a right triangle. A drawing element 35 is supported on frame 40 and a transfer lock chamber 36 is mounted on a pivot arm 41, pivot arm 41 being attached to a pivot bearing 44 mounted on leg 39.

In vacuum chamber 33 there is the crucible with the melt, from which the crystal is pulled through transfer lock 45 and into lock chamber 36 by means of drawing element 35.

Upon completion of the drawing process, drawing element 35 is separated from the crystal hanging in transfer lock chamber 36, and lock 45 is closed. After lock 45 is closed, lock chamber 36 can be pivoted in the direction of arrow A to a point where the crystal can be removed from the lock chamber and transported downward along the side of vacuum chamber 33.

Figure 2:
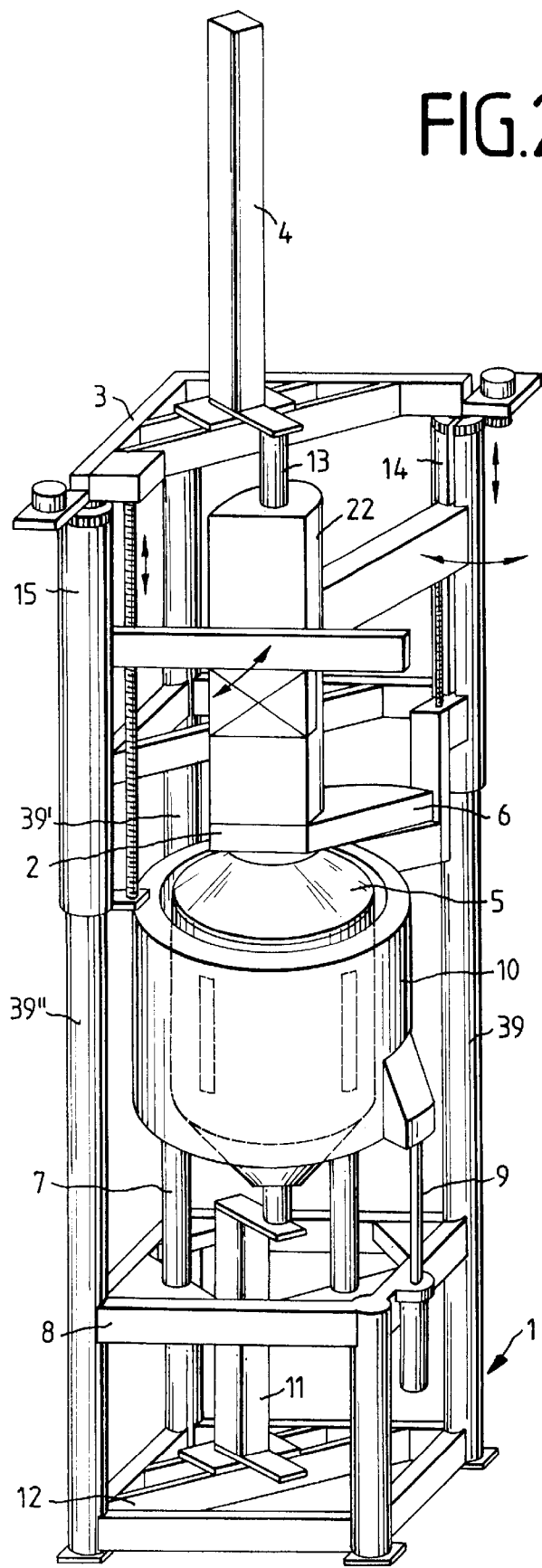
FIG. 2 is a perspective view of a second embodiment, with additional assemblies and handling systems mounted on the stand.

In the exemplary embodiment according to FIG. 2, a triangular top frame 3 is screwed to a four-legged base stand 1, designed as a grid-type pipe frame. Three of the four posts extend upward beyond transfer lock 2. A feed unit 4 (rod feed or cable feed) for drawing the crystal is mounted on this frame. Tank parts 5, lock valve 6, and lock 2 are supported by posts 7 resting on transverse beams 8 of base stand 1. A spool magnet 10 and its raising and lowering device 9 are also supported on transverse beams 8; the magnet generates a field which serves to stabilize and contain the melt. Transverse beams 8 are designed and located in such a way that magnet 10 can be lowered for the maintenance or cleaning of the system. Crucible feed 11 is supported on lower transverse beams 12 of base stand 1. Tank parts 5, lock valve 6, and lock 2 are positionally and vibrationally decoupled from feeds 4, 11 by bellows 13, so that no disadvantageous effect on the drawing process can occur as a result of vibrations or positional changes in tank parts 5, 6, 2.

It is now possible for various functional elements to be integrated into the upward-extended posts 39 of base stand 1, e.g., a specially designed handling device 14 for lock 2 and lock valve 6 or for tank parts 5 or for the mechanism which separates the crystal neck; holding devices for the crystals; or handling devices 15 for tank parts and/or hot-zone parts 16 inside tank 5. Accessory devices such as a loading device and a doping device can also be integrated.

The base stand is also suitable for the installation of intermediate platforms for cleaning and maintenance.

Figure 3:
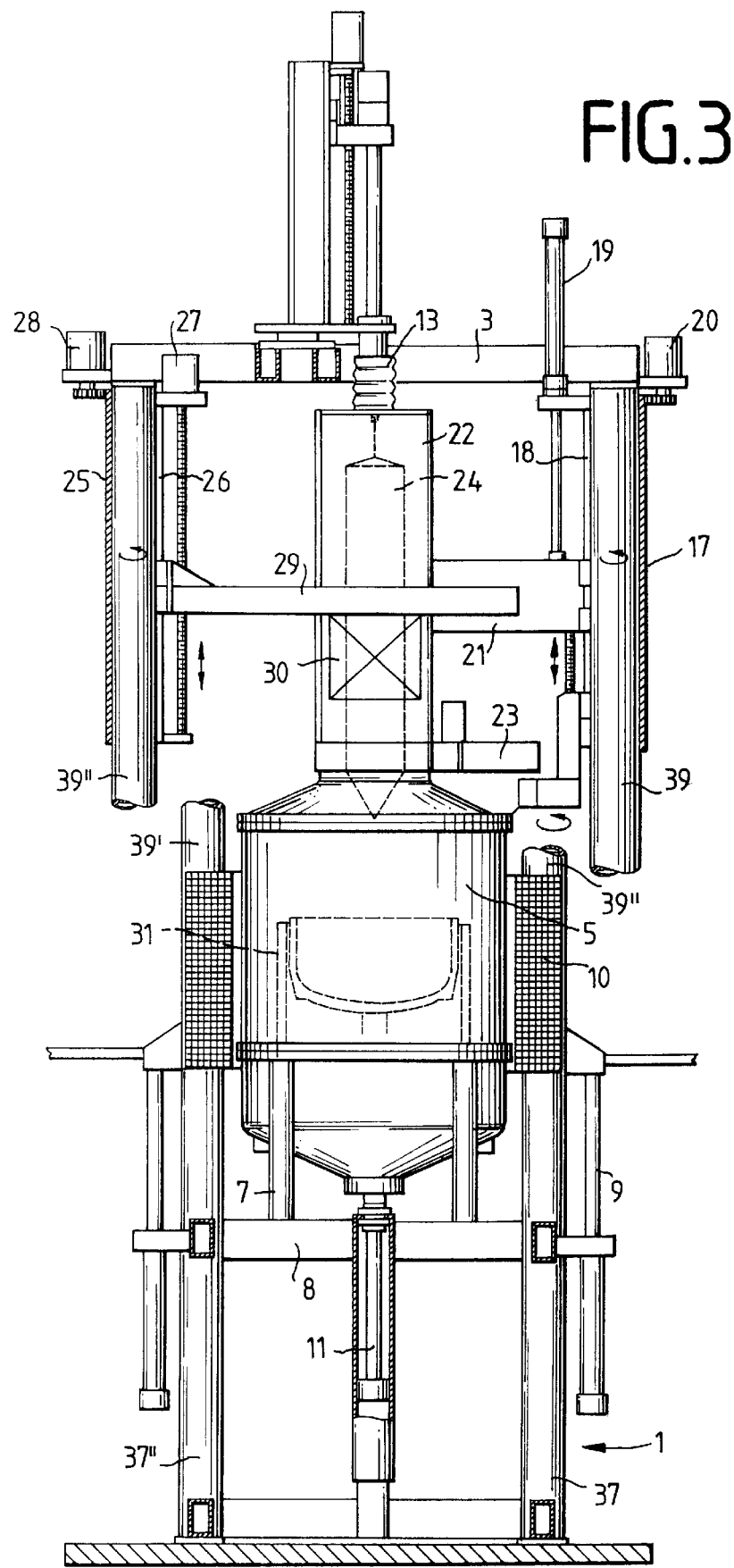
FIG. 3 shows two side views (one of the top, one of the bottom), rotated by 135° with respect to each other, of an apparatus similar to that of FIG. 2.

In the exemplary embodiment according to FIG. 3, a handling device is integrated into the right rear pillar of base stand 1, consisting of a pivot bearing 17, a linear guideway 18, a lifting unit 19, a pivoting unit 20, and a boom 21, which serves to raise and/or pivot transfer lock 22 and/or transfer lock valve 23 into an easily accessible position for maintenance and/or cleaning and/or for removal of crystal 24 from transfer lock 22.

By actuation of lifting unit 19, lock 22 and/or lock valve 23 is raised. By actuation of pivoting unit 20, lock 22 or lock valve 23 can be pivoted away from the tank components and brought into an easily accessible position.

A basic handling unit consists of a pivot bearing 28 and a boom 29. It serves to hold handling modules 30 for hot-zone components, tank components, magnets, and/or for crystal removal.

The desired handling module 30 (e.g., for hot-zone components) is suspended from boom 29. This is then brought by means of lifting unit 27 and pivoting unit 28 into the desired removal position. Handling module 30 accepts the intended component 31. Then component 31 is removed from the tank by means of units 27 and 28, pivoted into an easily accessible position, and set down.

We claim:

1. An apparatus for drawing single crystals from a melt, said apparatus comprising a base stand comprising four posts supporting a rectangular support platform, a vacuum chamber mounted on said support platform, said vacuum chamber having a cover, a crucible mounted in said vacuum chamber, means for heating a melt in said crucible, three vertical legs extending upward from three of said posts, said legs having top ends connected by a triangular frame, a transfer lock chamber mounted to pivot horizontally about an axis through one of said legs form a position over said cover to a position remote therefrom, drawing means for drawing a crystal from said melt upward through said cover and into said transfer lock chamber.

2. An apparatus as in claim 1 wherein said one of said legs forms a vertical pivot bearing to which a boom is journaled for pivoting said transfer lock chamber.

3. An apparatus as in claim 1 wherein said drawing means is mounted on said triangular frame.

4. An apparatus as in claim 1 further comprising a spool magnet surrounding the vacuum chamber, and means mounted on said platform for vertically moving said spool magnet with respect to said vacuum chamber.

\* \* \* \* \*